(12) United States Patent
Low et al.

(10) Patent No.: US 8,207,601 B2
(45) Date of Patent: Jun. 26, 2012

(54) ELECTRONIC COMPONENT AND A METHOD OF FABRICATING AN ELECTRONIC COMPONENT

(75) Inventors: Khai Huat Jeffrey Low, Melaka (MY); Chai Wei Heng, Melaka (MY); Wae Chet Yong, Melaka (MY)

(73) Assignee: Infinen Technologies AG, Neubiberg (DE)

( * ) Notice: Subject to any disclaimer, the term of this patent is extended or adjusted under 35 U.S.C. 154(b) by 469 days.

(21) Appl. No.: 12/145,832

(22) Filed: Jun. 25, 2008

(65) Prior Publication Data

US 2009/0001536 A1 Jan. 1, 2009

Related U.S. Application Data

(63) Continuation of application No. PCT/IB2005/003907, filed on Dec. 29, 2005.

(51) Int. Cl.
*H01L 23/495* (2006.01)

(52) U.S. Cl. ............... 257/676; 257/731; 257/E33.066; 438/123; 438/124

(58) Field of Classification Search ............ 257/23.031, 257/23.052, 23.141, E33.066, 678, 676; 437/216; 411/182; 338/260; 438/123, 124
See application file for complete search history.

(56) References Cited

U.S. PATENT DOCUMENTS

| | | | |
|---|---|---|---|
| 3,629,672 A | 12/1971 | Van de Water | |
| 3,649,944 A * | 3/1972 | Caddock | 338/260 |
| 4,888,307 A * | 12/1989 | Spairisano et al. | 264/272.17 |
| 5,514,913 A * | 5/1996 | Mangiagli et al. | 257/787 |
| 6,821,822 B1 | 11/2004 | Sato | |
| 2003/0006529 A1 | 1/2003 | Ho et al. | |
| 2004/0156694 A1* | 8/2004 | Behle et al. | 411/182 |

FOREIGN PATENT DOCUMENTS

| | | |
|---|---|---|
| EP | 0257681 A2 | 3/1988 |
| EP | 1408548 A2 | 4/2004 |
| JP | 59215751 A | 12/1984 |
| JP | 2003324116 | 11/2003 |
| WO | 2005069363 A1 | 7/2005 |

* cited by examiner

*Primary Examiner* — Matthew E Warren
*Assistant Examiner* — Fang-Xing Jiang
(74) *Attorney, Agent, or Firm* — Edell, Shapiro & Finnan, LLC

(57) ABSTRACT

An electronic component includes a lead frame assembly, an insert, a semiconductor chip and an encapsulation compound. The lead frame assembly includes a mounting hole, a die pad, a plurality of bonding fingers and a plurality of lead fingers. The insert includes a hollow center and is provided at the mounting hole of the lead frame assembly. The semiconductor chip is arranged on the die pad and includes contact areas on its surface. A plurality of electrical contacts respectively links the contact areas of the semiconductor chip to the bonding fingers of the lead frame assembly. An encapsulating compound encloses the insert, the semiconductor chip, and the electrical contacts, however, leaves the hollow center of the insert uncovered.

20 Claims, 3 Drawing Sheets

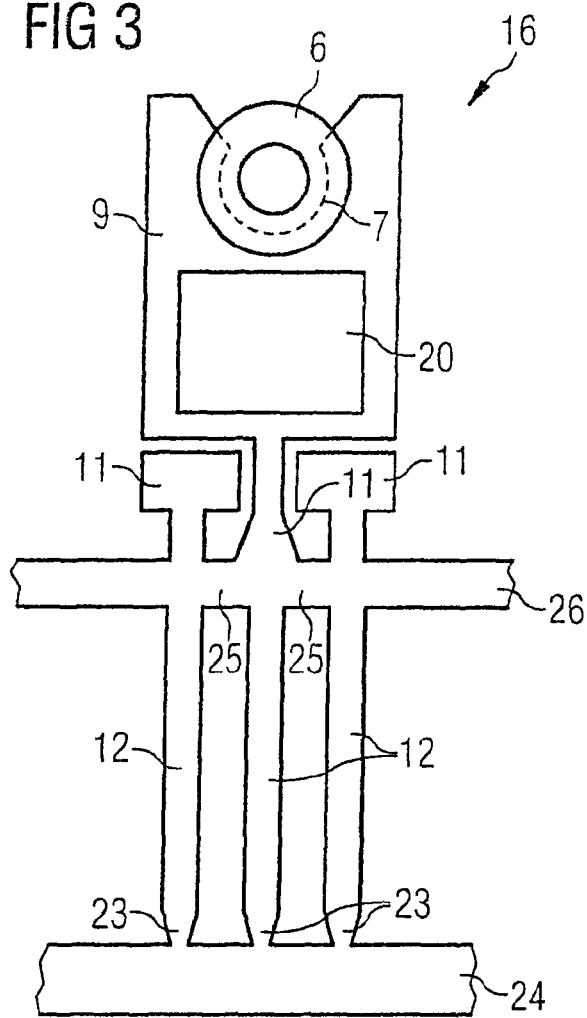
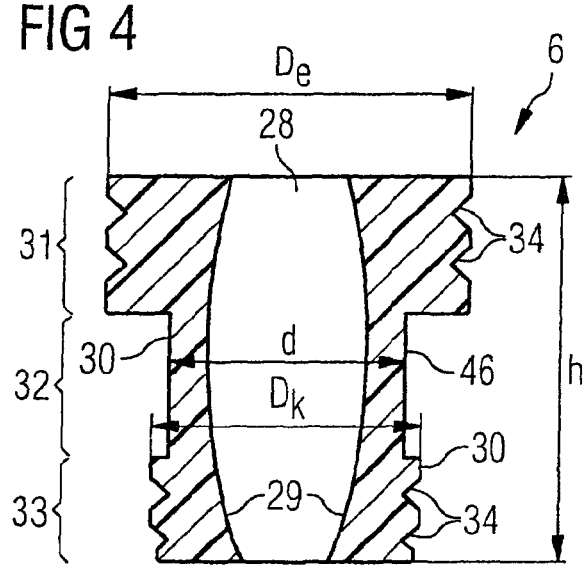

ELECTRONIC COMPONENT AND A METHOD OF FABRICATING AN ELECTRONIC COMPONENT

CROSS REFERENCE TO RELATED APPLICATIONS

This application is a continuation of International Application No. PCT/IB2005/003907, filed on Dec. 29, 2005, entitled "Electronic Component and a Method of Fabricating an Electronic Component," the entire contents of which are hereby incorporated by reference.

BACKGROUND

During encapsulation of an electronic component, without proper support, semiconductor chips tend to tilt. A tilted semiconductor chip ends up with a layer of encapsulation compound over one side of the semiconductor chip that is thicker than the layer at the other side of the semiconductor chip. This uneven distribution of encapsulation compound results in a degraded moisture resistance, crack resistance, and thermal conductivity of the encapsulated package. A method is known for molding a semiconductor chip wherein one or more support pins are placed in or removed from the mold cavity. The support pin is in contact with a lead frame assembly to support the lead frame assembly during a mold encapsulation process. The support pin is removed from the mold assembly as the encapsulation compound starts to harden. A disadvantage of the aforementioned method is that the support pin sustains severe wear from being in contact with the molten encapsulation compound. An improved method of encapsulating an electronic component is desired.

SUMMARY

A method of encapsulating a semiconductor chip, (e.g., a semiconductor package that has lead fingers on only one side of the package and that incorporates a mounting hole), is described herein. The semiconductor package comprises an electronic component with a lead frame assembly, an insert, a semiconductor chip and an encapsulation compound. The lead frame assembly includes a mounting hole, a die pad, a plurality of bonding fingers and a plurality of lead fingers. The insert includes a hollow center and is located at the mounting hole of the lead frame assembly. The semiconductor chip is arranged on the die pad. The semiconductor chip includes contact areas on the surface of the semiconductor chip. A plurality of electrical contacts links the contact areas of the semiconductor chip to the bonding fingers of the lead frame assembly. The encapsulating compound encloses the insert, the semiconductor chip, and the electrical contacts and leaves the hollow center of the insert, however, uncovered.

The above and still further features and advantages of the semiconductor package and method will become apparent upon consideration of the following definitions, descriptions and descriptive figures of specific embodiments thereof, wherein like reference numerals in the various figures are utilized to designate like components. While these descriptions go into specific details of the semiconductor package and method, it should be understood that variations may and do exist and would be apparent to those skilled in the art based on the descriptions herein.

BRIEF DESCRIPTION OF THE DRAWINGS

The invention is explained in more detail below with reference to accompanying drawings, where:

FIG. 3 shows a top view of a lead frame assembly with an insert according to an embodiment;

FIG. 4 shows a cross section view of an insert for the lead frame assembly according to FIG. 3.

DETAILED DESCRIPTION

Figure 1:
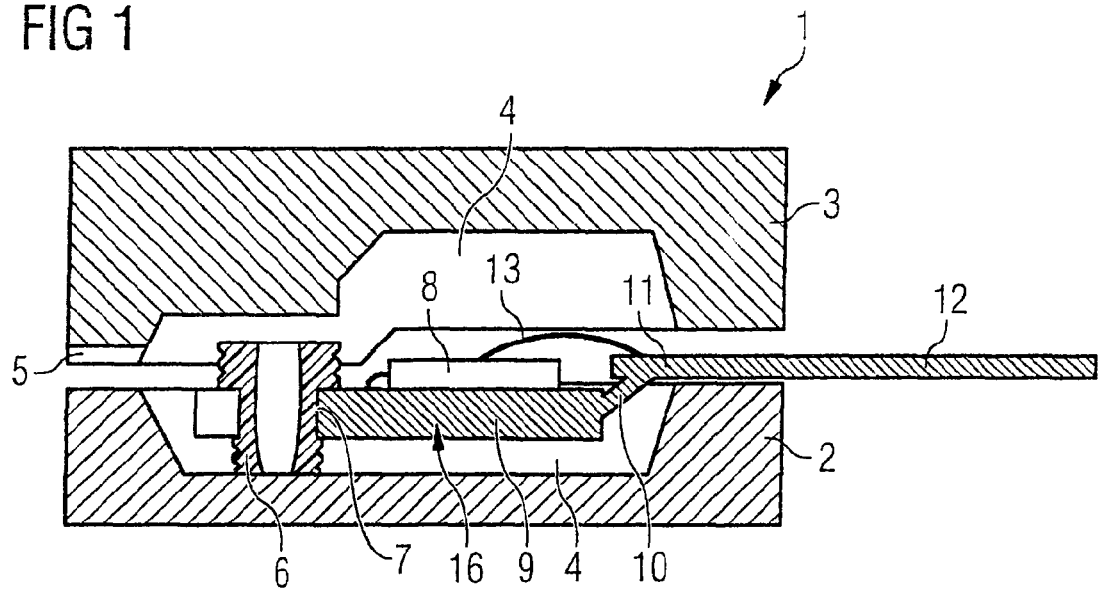
FIG. 1 shows a cross section view of an open mold assembly with a lead frame assembly and a semiconductor chip according to an embodiment.

A method of encapsulating a semiconductor chip, (e.g., a single-ended package with a heat sink mountable hole) is described herein. An electronic component comprises a lead frame assembly, an insert, a semiconductor chip, a plurality of electrical contacts and a body of encapsulating compound. The lead frame assembly includes a mounting hole, a die pad, a plurality of bond fingers and a plurality of lead fingers. The die pad is placed between the mounting hole and the bond fingers. A lead finger is connected to a bond finger. An insert with a hollow center is provided at the mounting hole of the lead frame assembly. A semiconductor chip is attached to the die pad of the lead frame assembly by an adhesive layer. The semiconductor chip has an active surface and a passive surface. The passive surface of the semiconductor chip is attached to the die pad. On the active surface of the semiconductor chip, there are a plurality of contact pads and electrical circuits that are connected to the contact pads. The contact pads of the semiconductor chip are connected by electrical conductors, such as bond wires, with the bonding fingers of the lead frame assembly. An encapsulating compound covers the semiconductor chip, the electrical contacts, and the insert but leaves the hollow center of the insert uncovered.

Lead fingers and an insert support the lead frame assembly during the package encapsulation process. The support provided by the insert is of particular importance, for example, during the encapsulation of an electronic device that comprises lead fingers on only one side of the package.

During the package encapsulating process the lead frame assembly, with the exception of the lead fingers, is located inside the mold cavity. Molten encapsulating compound is injected under pressure into the mold cavity during the package encapsulation process. The flow of the molten encapsulating compound in the mold cavity exerts a tilting force on the lead frame assembly. However, the support given by the lead fingers and the insert prevents the lead frame assembly from tilting. According to an embodiment, the mold assembly clamps the insert and lead fingers during the package encapsulation process to prevent the insert and lead fingers from shifting. Furthermore, since there are no moving parts within the mold cavity, the encapsulated package does not suffer from surface marks caused by moving parts or incur maintenance costs related to moving parts.

The insert is made of a material, such as elastomer, that is elastic and that can withstand temperature up to 200 degrees Celsius. The elastic property of the insert allows the insert to flex when it is under compressive force during the encapsulation process. The high temperature tolerance property of the insert allows the insert to withstand molten encapsulating compound surrounding the insert during package encapsulation. Molten encapsulating compound has a temperature of approximately 175 degrees Celsius.

When the insert is placed in the mounting hole of a lead frame assembly, the top and bottom portion of the insert protrude outside the mounting hole of the lead frame assembly. The insert has v-shaped grooves on the external surface of the top portion and bottom portion of the insert. These grooves allow the insert to adhere with the encapsulating compound that surrounds the insert during package encapsulation.

The insert includes a hollow center and the surface of the hollow center is concave. This concave feature of the insert keeps the insert from buckling when a compressive force is applied to the top and bottom surface of the insert. A compressive force is applied to the insert during the package encapsulation process when the mold assembly closes and the internal surfaces of the mold assembly press against the top and bottom surface of the insert.

A bottom portion of the insert may have an external diameter slightly larger than the diameter of the mounting hole. This allows the insert to be formed and then placed vertically into the mounting hole. The mounting hole may also have an opening on the side for receiving the insert.

A method of fabricating an electronic component comprises providing a semiconductor chip on the lead frame assembly. Electrical contacts, such as bond wires, are then provided between the contact regions of the semiconductor chip and the bonding fingers of the lead frame assembly. The insert may be formed using a process such as molding and then inserted into the mounting hole of the lead frame assembly. Alternatively, the insert may be formed directly onto the mounting hole. An encapsulating compound is next provided over the semi-conductor chip, the bond wires, and the insert and leaving free the hollow center of the insert.

In the following paragraphs, exemplary embodiments of the semiconductor package and method are described in connection with the figures.

Figure 2:
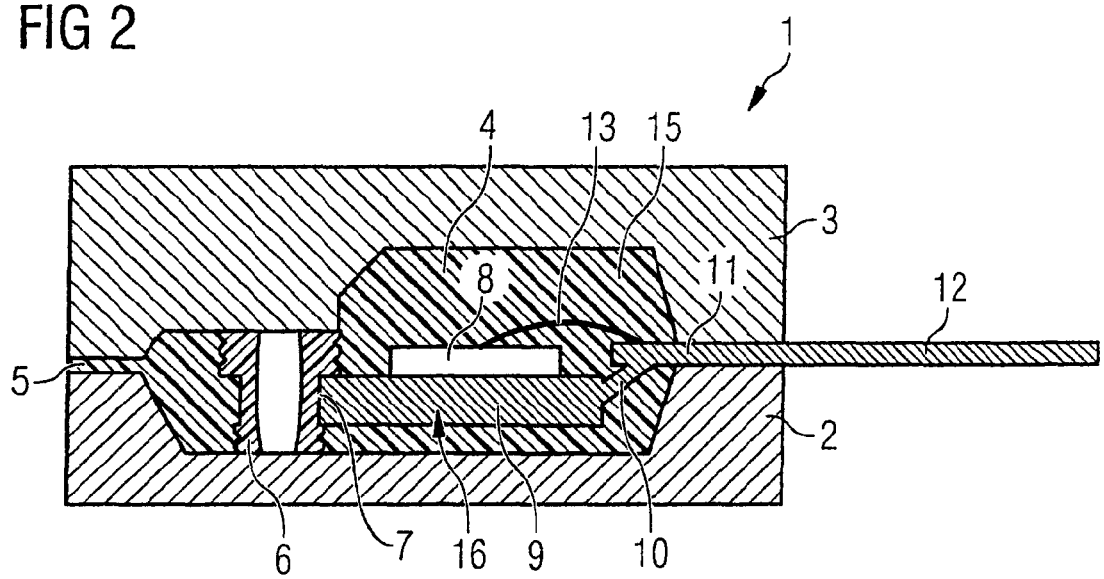
FIG. 2 displays a cross section view of the mold assembly in a closed state filled with encapsulation compound.

FIG. 1 and FIG. 2 show a cross section view of a mold assembly 1. The mold assembly 1 comprises a lower mold 2 and an upper mold 3 on top of the lower mold 2. The lower mold 2 is placed apart from the upper mold 3 in FIG. 1. The space between the lower mold 2 and the upper mold 3 forms a mold cavity 4. A gate 5 is formed as a canal on the peripheral of the upper mold 3, which is at the left side of the upper mold 3.

Within the mold cavity 4 there is provided a lead frame assembly 16 with an insert 6, and with a semiconductor chip 8. The insert 6 is placed on the upper surface of the lower mold 2. The insert 6 is connected to a mounting hole 7 of the lead frame assembly 16. The lead frame assembly 16 is placed laterally over the lower mold 2 and it comprises a mounting hole 7, a die paddle 9, a metal link 10, bonding fingers 11, and lead fingers 12. The die paddle 9 is located to the right of the insert 6. The metal link 10 is positioned on the right side of the die paddle 9. The metal link 10 connects the die paddle 9 to the bonding fingers 11. The bonding finger 11 is linked to a lead finger 12. The lead fingers 12 are placed over the peripheral of the right side of the lower mold 2. The lead fingers 12 are connected to each other by metal links, which is not shown in FIG. 1. The lead fingers 12 protrude outside the mold assembly 1.

On the die paddle 9, there is provided a semiconductor chip 8. The semiconductor chip 8 comprises electrical circuitry and a plurality of connection pads connected to the electrical circuitry. The connection pads and the electrical circuitry are not shown in FIG. 1. Bond wires 13 connect the connection pads of the semiconductor chip 8 to the bonding fingers 11 of the lead frame assembly.

FIG. 2 shows the mold assembly 1 of FIG. 1 in a closed state. The upper mold 3 is tightly placed over the lower mold 2. The peripherals of the upper mold 3 and the lower mold 4 forms a clamp over the lead fingers 12. Moreover, the internal upper and internal lower surfaces of the mold assembly 14 exert a compressive force on the insert 6. The mold cavity 4 is filled with an encapsulation compound 15.

The gate 5, which is located on the left side of the mold assembly 1, is a passageway for the injection of molten encapsulating compound 15 by a hydraulic plunger, which is not shown in FIG. 2, into the mold cavity 4 to form an encapsulation body over the semiconductor chip 8. The encapsulation compound turns molten at temperature of about 175 degrees Celsius. As the molten encapsulation compound 15 flows into the mold cavity 4, it loses heat and increases in viscosity. The flow rate and the viscosity of the molten encapsulation compound 15 exert a tilting force on the semiconductor chip 8 and the lead frame assembly 16 in the direction of the flow of the encapsulation compound. The semiconductor chip 8 and the lead frame assembly 16 within the mold assembly 1 are anchored against this tilting force by the insert 6 and by the lead fingers 12. The insert 6 is connected to the lead frame assembly 16 and the insert 6 is prevented from shifting by the compressive force exerted on the top and bottom surfaces of the insert 6 by the upper 3 and lower mold 2. The lead fingers 12 are connected to the lead frame assembly 16 and are therefore prevented from shifting by the clamping force that the closed mold assembly 1 exerts on the lead fingers 12.

FIG. 3 shows a top view of the lead frame assembly 16 according to an embodiment. The top portion of the lead frame assembly 16 has a mounting hole 7 with an elastic insert 6 placed inside the mounting hold 7. Below the mounting hole 7 there is provided a die paddle 9. On the front surface of the die paddle 9 there is located a die pad 20. Bonding fingers 12 extend from the die paddle 9. The central bonding finger 11 provides a link between the die paddle 9 and the lead fingers 12. Below each bonding finger 11 there is connected a vertical lead finger 12. At the bottom of the lead fingers 12 there is provided a lead tip 23. The lead tips 23 are connected to a lateral bottom metal strip 24 located at the bottom of the lead frame assembly 16. Metal links 25 located below the bonding fingers 11 connect the adjacent lead fingers 12 together. These metal links 25 form a dam bar 26. This lead frame assembly 16 is part of a lead frame strip that is not shown in FIG. 3. The lead frame strip comprises fifteen lead frame assemblies 16.

According to an embodiment, the insert 6 is introduced in the mounting hole 7. The mounting hole 7 is of a partial circular shape, which forms a grip on the insert 6. The mounting hole 7 is intended for the mounting of a heat sink in an end-user application. The die pad 20 is used for a later placement of a semiconductor chip. The bonding finger 11 serves as a landing pad for a bonding wire which is connecting the bonding finger 11 to a contact pad of the semiconductor chip. During the package encapsulation process, molten encapsulating compound covers the top portion of the lead frame assembly 16. The dam bar 26 prevents molten mold compound from reaching the lead fingers 12 located below the dam bar 26. After the encapsulation process, the metal links 25 between adjacent lead fingers 12 and the lateral bottom metal strip 24 are removed. The lead frame assembly 16 is used in the mold assembly 1 of FIG. 1 and FIG. 2.

FIG. 4 shows a cross section view of the insert 6 of FIG. 3. The insert 6 includes a vertical hollow center 28. The internal surface 29 of the insert 6 is concave. The insert 6 comprises a top 31, middle 32, and bottom portion 33. The top portion 31 and the bottom portion 33 of the insert 6 comprise v-shaped grooves 34 on their external surfaces 30. The middle portion 32 has a flat external surface 46. The top portion 31 of the insert 6 comprises a wider external diameter De than external diameter Dk of the bottom portion 33. The insert 6 has a height h of about 4.7 millimeters and a diameter d of the middle portion of about 2.95 millimeters.

The insert 6 is elastic and is made of an elastomer material that tolerates temperatures of up to about 200 degrees Celsius. The internal concave shape of the insert 6 keeps it from buckling when a compressive pressure is applied to its top surface and bottom surface. The v-shaped grooves 34 on the top portion 31 and bottom portion 33 of the insert 6 allow the insert 6 to adhere to an encapsulating compound that surrounds the insert 6 during application. When the insert 6 is plugged into the mounting hole 7 of the lead frame assembly 16, the top portion 31 and the bottom portion 33 will protrude outside the lead frame assembly 16. The external diameter d of the middle portion 32 of the insert 6 and the diameter of the mounting hole 7 of the lead frame assembly 16 is approximately the same to eliminate any play between the insert 6 and the mounting hole 7.

Figure 5:
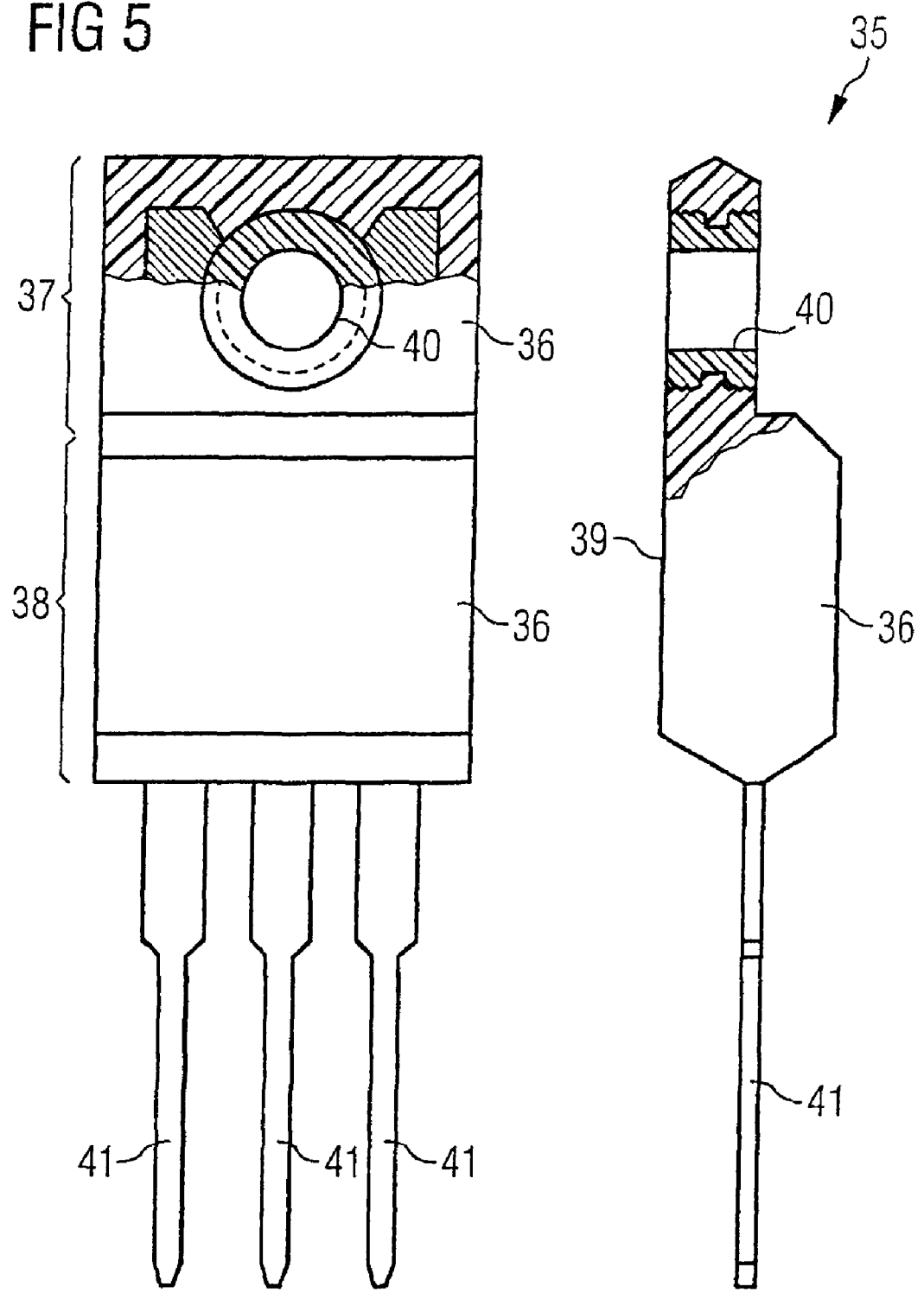
FIG. 5 displays an electronic component according to an embodiment.

FIG. 5 shows an electronic component 35 which is produced according to an embodiment of the method. The top portion of the electronic component 35 shows an encapsulated body 36. The encapsulated body 36 has an upper portion 37 and a lower portion 38. The upper portion 37 of the encapsulated body 36 has a thickness less than the thickness of the lower portion 38. The rear surface 39 of the encapsulated body 36 is flat. The upper portion 37 of the encapsulated body 36 includes a mounting hole 40. Lead fingers 41 are located below the lower portion 38 of the electronic component 35. The lead finger 41 is electrically isolated from the other lead fingers 41.

The mounting hole 40 allows a heat sink to be attached to the flat rear surface 39 of the encapsulated body 36. Embedded within the encapsulated body 36 are a semiconductor chip, a die paddle, and bond wires. The electronic component is partly cut in FIG. 5. One can see a cross section view of part of the lead frame assembly 16 and the insert 6. The front surface and rear surface of the insert 6 are flat with the front surface and rear surface of the upper portion 37.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An electronic component, comprising:
   a lead frame assembly including: a mounting hole, a die pad, and a plurality of lead fingers;
   an insert provided at the mounting hole, the insert having a hollow center extending from a planar front surface to a planar rear surface of the insert;
   a semiconductor chip disposed on the die pad and electrically connected to the lead fingers; and
   an encapsulating compound covering at least parts of the insert, parts of the lead frame assembly and parts of the semiconductor chip, wherein the front surface of the insert is coplanar with a portion of a front surface of the electronic component comprising the encapsulating compound, and the rear surface of the insert is coplanar with a portion of a rear surface of the electronic component comprising the encapsulating compound.

2. The electronic component of claim 1, further comprising:
   electrical contacts electrically connecting contact areas of the semiconductor chip to respective bonding fingers of the lead frame, the bonding fingers being physically and electrically connected to the lead fingers.

3. The electronic component of claim 1, wherein the lead fingers are located at one side of the electronic component.

4. The electronic component of claim 1, wherein the insert comprises elastic material with a melting point of higher than 200 degrees Celsius.

5. The electronic component of claim 1, wherein the insert comprises recesses on at least part of its external surface.

6. The electronic component of claim 1, wherein an internal surface of the insert along the hollow center has a concave shape over an entire extent of the internal surface from the front surface to the rear surface of the insert.

7. The electronic component of claim 1, wherein the mounting hole comprises an opening at a side portion to receive the insert.

8. The electronic component of claim 1, wherein the hollow center of the insert extends completely through the electronic component from the front surface to the rear surface of the electronic component.

9. The electronic component of claim 1, wherein the mounting hole has a partial circular shape in a plane extending longitudinally through the lead frame assembly, the lead frame assembly further including an opening extending from a lateral side edge of the lead frame assembly to the mounting hole.

10. The electronic component of claim 1, wherein the insert comprises: a top portion that lies above a top surface of the lead frame assembly; a bottom portion that lies below a lower surface of the lead frame assembly; and a middle portion that lies within the mounting hole of the lead frame assembly, wherein the top and bottom portions of the insert have a larger diameter than the middle portion of the insert.

11. The electronic component of claim 1, wherein side surfaces of the insert comprise V-shaped grooves.

12. A method of fabricating an electronic component, the method comprising:
   (a) arranging a semiconductor chip on a lead frame assembly including bonding fingers;
   (b) applying contacts between contact areas of the semiconductor chip and the bonding fingers;
   (c) providing an insert in the mounting hole, the insert having a hollow center extending from a planar front surface to a planar rear surface of the insert; and
   (d) covering the semiconductor chip, at least part of the insert and part of the lead frame assembly with encapsulating compound, wherein the front surface of the insert is coplanar with a portion of a front surface of the electronic component formed by the encapsulating compound, and the rear surface of the insert is coplanar with a portion of a rear surface of the electronic component formed by the encapsulating compound.

13. The method of claim 12, wherein V-shaped grooves are formed in side surfaces of the insert.

14. The method of claim 12, wherein the lead assembly further comprises lead fingers extending from the bonding fingers and (d) comprises:
   clamping the lead fingers and compressing the insert by a mold assembly.

15. The method of claim 12, wherein (c) comprises inserting a preformed insert in the mounting hole.

16. The method of claim 12, wherein (c) comprises forming the insert directly onto the mounting hole.

17. The method of claim 12, wherein the electronic component is fabricated such that the hollow center of the insert extends completely through the electronic component from the front surface to the rear surface of the electronic component.

18. The method of claim 12, wherein an internal surface of the insert along the hollow center has a concave shape over an entire extent of the internal surface from the front surface to the rear surface of the insert.

19. The method of claim 12, wherein the mounting hole has a partial circular shape in a plane extending longitudinally through the lead frame assembly, the lead frame assembly further including an opening extending from a lateral side edge of the lead frame assembly to the mounting hole, wherein (c) includes inserting the insert into the mounting hole via the opening.

20. The method of claim 12, wherein the insert comprises: a top portion that lies above a top surface of the lead frame assembly; a bottom portion that lies below a lower surface of the lead frame assembly; and a middle portion, wherein the top and bottom portions of the insert have a larger diameter than the middle portion of the insert, wherein (c) includes inserting the middle portion of the insert into the mounting hole of the lead frame assembly.

* * * * *